United States Patent
Jiang et al.

(10) Patent No.: US 9,721,902 B2
(45) Date of Patent: Aug. 1, 2017

(54) METHOD OF MANUFACTURING RF POWER AMPLIFIER MODULE, RF POWER AMPLIFIER MODULE, RF MODULE, AND BASE STATION

(71) Applicant: SAMSUNG ELECTRONICS CO., LTD., Suwon-si (KR)

(72) Inventors: Wei Jiang, Shenzhen (CN); Yiwei Ma, Shenzhen (CN); Jinpei Ju, Shenzhen (CN); Hongmei Hu, Shenzhen (CN); Qin Gong, Shenzhen (CN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/836,301

(22) Filed: Aug. 26, 2015

(65) Prior Publication Data

US 2016/0065144 A1 Mar. 3, 2016

(30) Foreign Application Priority Data

Aug. 26, 2014 (CN) .......................... 2014 1 0423542
Jul. 8, 2015 (KR) ........................ 10-2015-0097161

(51) Int. Cl.
*H03F 1/30* (2006.01)
*H03F 3/19* (2006.01)
(Continued)

(52) U.S. Cl.
CPC .......... *H01L 23/552* (2013.01); *H01L 23/057* (2013.01); *H01L 23/36* (2013.01);
(Continued)

(58) Field of Classification Search
USPC ................................................... 330/307, 65
See application file for complete search history.

(56) References Cited

U.S. PATENT DOCUMENTS

| 7,446,411 B2 | 11/2008 | Condie et al. |
| 8,633,393 B2 | 1/2014 | Yang et al. |
| (Continued) | | |

FOREIGN PATENT DOCUMENTS

| CN | 101460018 A | 6/2009 |
| CN | 101553918 A | 10/2009 |
| (Continued) | | |

OTHER PUBLICATIONS

Communication dated Jun. 30, 2016, from the State Intellectual Property Office of People's Republic of China in counterpart Application No. 201410423542.X.

*Primary Examiner* — Hieu Nguyen
(74) *Attorney, Agent, or Firm* — Sughrue Mion, PLLC

(57) ABSTRACT

The present disclosure relates to a radio frequency (RF) unit of a base station, and more particularly, to a method of manufacturing an RF power amplifier module, an RF power amplifier module, an RF module, and a base station. The RF power amplifier module includes at least a power device, a power circuit board, a heat-dissipation substrate, and input/output ports. A power device die of the power device and the power circuit board are mounted on the heat-dissipation substrate. The power device die is connected to the power circuit board through packaging lead wires. In one exemplary embodiment, a heat-dissipation effect and manufacturing efficiency of the RF power amplifier module are improved and a cost of the RF power amplifier module is reduced.

20 Claims, 5 Drawing Sheets

(51) Int. Cl.
*H01L 23/552* (2006.01)
*H01L 23/057* (2006.01)
*H01L 23/36* (2006.01)
*H01L 23/66* (2006.01)
*H01L 23/00* (2006.01)

(52) U.S. Cl.
CPC .............. *H01L 23/66* (2013.01); *H01L 24/29* (2013.01); *H01L 24/32* (2013.01); *H01L 24/48* (2013.01); *H01L 24/73* (2013.01); *H01L 2223/6611* (2013.01); *H01L 2223/6644* (2013.01); *H01L 2224/291* (2013.01); *H01L 2224/32245* (2013.01); *H01L 2224/48091* (2013.01); *H01L 2224/48137* (2013.01); *H01L 2224/48195* (2013.01); *H01L 2224/48227* (2013.01); *H01L 2224/48247* (2013.01); *H01L 2224/73265* (2013.01); *H01L 2924/00014* (2013.01); *H01L 2924/1421* (2013.01); *H01L 2924/15153* (2013.01); *H01L 2924/16152* (2013.01); *H01L 2924/16153* (2013.01); *H01L 2924/16251* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

2004/0238934 A1* 12/2004 Warner ................ H01L 23/24
257/686
2015/0103491 A1    4/2015 Ma

FOREIGN PATENT DOCUMENTS

| CN | 102623416 A | 8/2012 |
|----|-------------|--------|
| JP | 2004-296565 A | 10/2004 |

* cited by examiner

METHOD OF MANUFACTURING RF POWER AMPLIFIER MODULE, RF POWER AMPLIFIER MODULE, RF MODULE, AND BASE STATION

CROSS-REFERENCE TO RELATED APPLICATION

This application claims the benefit of Chinese Patent Application No. 201410423542.X filed on Aug. 26, 2014, in the State Intellectual Property Office and Korean Patent Application No. 10-2015-0097161, filed on Jul. 8, 2015, in the Korean Intellectual Property Office, the disclosure of which is incorporated herein in its entirety by reference.

BACKGROUND

1. Field

The present disclosure relates to radio frequency (RF) units of base stations, and more particularly, to methods of manufacturing RF power amplifier modules, RF power amplifier modules, RF modules, and base stations.

2. Description of the Related Art

A package power device generally includes a package structure (e.g., a ceramic package structure) including input/output pins. Other components are connected through the input/output pins. The input/output pins are mounted on a printed circuit board (PCB) by using soldering in order to enable electrical connection between the PCB and the package power device. However, this results in a high packaging cost which accounts for 80% of the price of a whole device. However, if a power device does not include the package structure, the power device requires a carrier flange that is expensive.

SUMMARY

Provided are methods of manufacturing radio frequency (RF) power amplifier modules, RF amplifier modules, RF modules, and base stations which may reduce the complexity of assembling the RF modules and the cost of a power device, and may improve a heat-dissipation effect of the power device.

Additional aspects will be set forth in part in the description which follows and, in part, will be apparent from the description, or may be learned by practice of the presented exemplary embodiments.

According to an aspect of an exemplary embodiment, a radio frequency (RF) power amplifier module includes: a power device including a power device die and affiliated electronic components that are connected to each other through lead wires; a power circuit board connected to the power device through the lead wires; a heat-dissipation substrate to which the power device and the power circuit board are adhered; and an auxiliary circuit board connected to the power circuit board.

The RF power amplifier module may further include a protective cover mounted to form a cavity between the protective cover and the power device.

The protective cover may include: a first protective cover fixed to the power circuit board and covering the power circuit board and the power device; and a second protective cover fixed to the auxiliary circuit board and covering the auxiliary circuit board, the power circuit board, and the first protective cover, wherein the first protective cover forms a cavity between the first protective cover and the power circuit board, and the second protective cover forms a cavity between the second protective cover and the first protective cover.

The protective cover may be fixed to the auxiliary circuit board and cover the auxiliary circuit board, the power circuit board, and the power device.

The protective cover may be fixed to the power circuit board and form a plurality of cavities between the protective cover and the power device and the auxiliary circuit board.

The heat-dissipation substrate may include one metal plate or alloy plate or a combination of at least two metal plates or alloy plates.

The power circuit board may be adhered onto the auxiliary circuit board, wherein the RF power amplifier module further includes a thermally conductive packing material disposed between the heat-dissipation substrate and a housing or an extending structure of the housing.

A surface of the housing that is adhered to the thermally conductive packing material and a surface of the housing that is adhered to the auxiliary circuit board may be flat.

The auxiliary circuit board may be connected to the power circuit board through connectors, and the auxiliary circuit board may be placed under the power circuit board.

According to an aspect of another exemplary embodiment, a method of assembling a radio frequency (RF) power amplifier module includes: adhering, to a heat-dissipation substrate, a power circuit board and a power device that includes a power device die and affiliated electronic components; connecting the power device and the power circuit board through lead wires; and assembling an auxiliary circuit board, the heat-dissipation substrate, the power circuit board, and the power device to form an assembly structure, and mounting the assembly structure on a housing that abuts onto the heat-dissipation substrate.

The method may further include mounting a protective cover for forming a cavity between the protective cover and the power device.

The mounting of the protective cover may include: mounting a first protective cover that is fixed to the power circuit board and covers the power circuit board and the power device; and mounting a second protective cover that is fixed to the auxiliary circuit board and covers the auxiliary circuit board, the power circuit board, and the first protective cover, wherein a cavity is formed between the first protective cover and the power circuit board and a cavity is formed between the second protective cover and the first protective cover.

The mounting of the protective cover may include mounting the protective cover that is fixed to the auxiliary circuit board, wherein the protective cover covers the auxiliary circuit board, the power circuit board, and the power device.

The protective cover may be fixed to the power circuit board and form a plurality of cavities between the protective cover and the power device and the auxiliary circuit board.

The method may further include adhering the power circuit board on the auxiliary circuit board, and disposing a thermally conductive packing material between the heat-dissipation substrate and the housing or an extending structure of the housing.

A surface of the housing that is adhered to the thermally conductive packing material and a surface of the housing that is adhered to the auxiliary circuit board may be flat.

The method may further include connecting the auxiliary circuit board and the power circuit board through connectors, and placing the auxiliary circuit board under the power circuit board.

According to an aspect of another exemplary embodiment, a method of assembling a radio frequency (RF) power amplifier module includes: fixing a power circuit board to a heat-dissipation substrate; bonding, to the heat-dissipation substrate, a power device including a power device die and affiliated electronic components that are connected to each other through lead wires, and adhering the heat-dissipation substrate to the power circuit board; and assembling an auxiliary circuit board with the heat-dissipation substrate, the power device, and the power circuit board to form an assembly structure.

According to an aspect of another exemplary embodiment, a radio frequency (RF) module includes: the RF power amplifier module; and a housing fixing a part of the auxiliary circuit board and abutting onto the heat-dissipation substrate.

According to an aspect of another exemplary embodiment, a base station includes a radio frequency (RF) module, an antenna, a baseband unit, and a signal transmission unit, wherein the RF module includes: the RF power amplifier module; and a housing fixing a part of the auxiliary circuit board and abutting onto the heat-dissipation substrate.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

The inventive concept will now be described more fully with reference to the accompanying drawings for those of ordinary skill in the art to be able to perform the inventive concept without any difficulty. As used herein, the term "and/or" includes any and all combinations of one or more of the associated listed items. Expressions such as "at least one of," when preceding a list of elements, modify the entire list of elements and do not modify the individual elements of the list.

Figure 1:
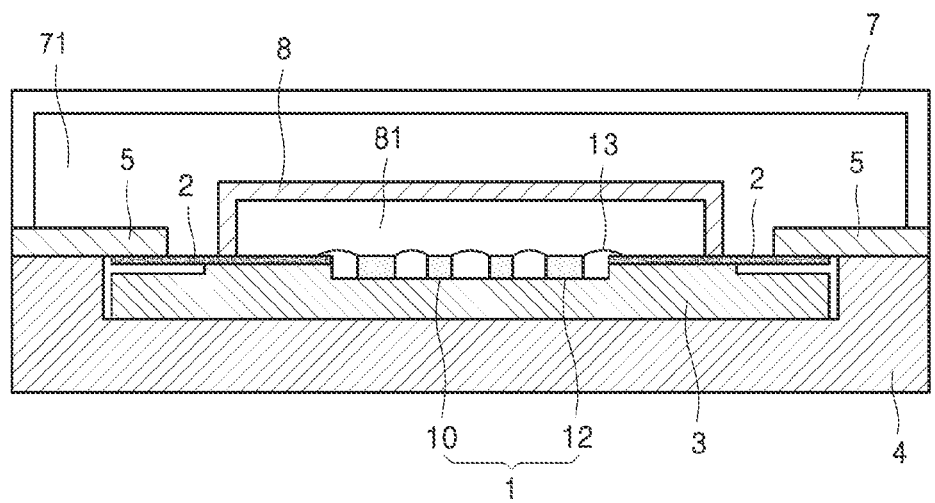
FIG. 1 is a cross-sectional view of a radio frequency (RF) power amplifier module including a plurality of protective covers, according to an exemplary embodiment.

FIG. 1 is a cross-sectional view of a radio frequency (RF) power amplifier module including a plurality of protective covers, according to an exemplary embodiment. Referring to FIG. 1, the RF power amplifier module includes a power device 1, a power circuit board 2, a heat-dissipation substrate 3, an auxiliary circuit board 5, and input/output ports (not shown).

According to an exemplary embodiment, the power device 1 that is used to amplify power includes a power device die 10 and affiliated electronic components 12. In this case, the affiliated electronic components 12 include at least one of resistors, capacitors, isolators, couplers, and input/output ports. Both the power device die 10 and the power circuit board 2 to which the affiliated electronic components 12 are connected are directly fixed to the heat-dissipation substrate 3. Also, the power device die 10, the affiliated electronic components 12, and the power circuit board 2 are connected to one another through packaging lead wires 13. Also, the power device die 10, the affiliated electronic components 12, and the power circuit board 2 constitute a local power amplifier module.

According to an exemplary embodiment, the local power amplifier module, a housing 4 of an RF power amplifier module, and the auxiliary circuit board 5 are stacked in order to form the RF power amplifier module. In detail, the heat-dissipation substrate 3 is disposed under both the power circuit board 2 and the power device 1 and over the housing 4 of the RF power amplifier module. The heat-dissipation substrate 3 may be combined with one or more metal plates (or alloy plates) by using crimping, adhesion, soldering, or fastening screws. Also, the power device die 10, the affiliated electronic components 12, and the power circuit board 2 are adhered to the heat-dissipation substrate 3 in order to form the local power amplifier module, and at least a part of both sides of the power circuit board 2 that are spaced apart from the power device 1 does not directly contact the heat-dissipation substrate 3.

Since a part of a bottom surface of the auxiliary circuit board 5 is fixed to the housing 4 of the RF power amplifier module or an extending structure of the housing 4 and the other part of the bottom surface of the auxiliary circuit board 5 is fixed to both sides of the power circuit board 2, electrical connection between the auxiliary circuit board 5 and the local power amplifier module is achieved and the auxiliary circuit board 5 is is restrained from the power circuit board 2 (e.g., a downward pressure is generated). Accordingly, the heat-dissipation substrate 3 that is fixed to the power circuit board 2 may prevent to abut onto the housing 4 of the RF power amplifier module through deformation of the power circuit board 2.

Also, in order to achieve a high contact effect to improve a heat-dissipation effect of the power device 1, the housing 4 of the RF power amplifier module may be in contact with the heat-dissipation substrate 3. In this case, a size of each of the power circuit board 2 and the heat-dissipation substrate 3 may be adjusted according to actual demand. For example, a transceiver unit TRX and a power panel may be disposed on the auxiliary circuit board 5. Also, the input/output ports may be connected to the transceiver unit TRX of the auxiliary circuit board 5.

Also, the power device die 10, the affiliated electronic components 12, and the power circuit board 2 may be soldered onto the heat-dissipation substrate 3. Also, the other part of the auxiliary circuit board 5 is soldered to both sides of the power circuit board 2. In detail, the auxiliary circuit board 5 may be mounted by using soldering on the top of the power circuit board 2.

According to an exemplary embodiment, the RF power amplifier module may further include a first protective cover 8 and a second protective cover 7.

Referring to FIG. 1, the first protective cover 8 that is fixed to the power circuit board 2 by using soldering or fastening screws may cover the power circuit board 2 and the affiliated electronic components 12 in order to form a closed cavity 81 for electromagnetic shielding and protection. Also, the second protective cover 7 that is fixed to the auxiliary circuit board 5 may cover the auxiliary circuit board 5, the power circuit board 2, and the first protective cover 8 in order to form a closed cavity 71 for electromagnetic shielding and protection.

Figure 2:
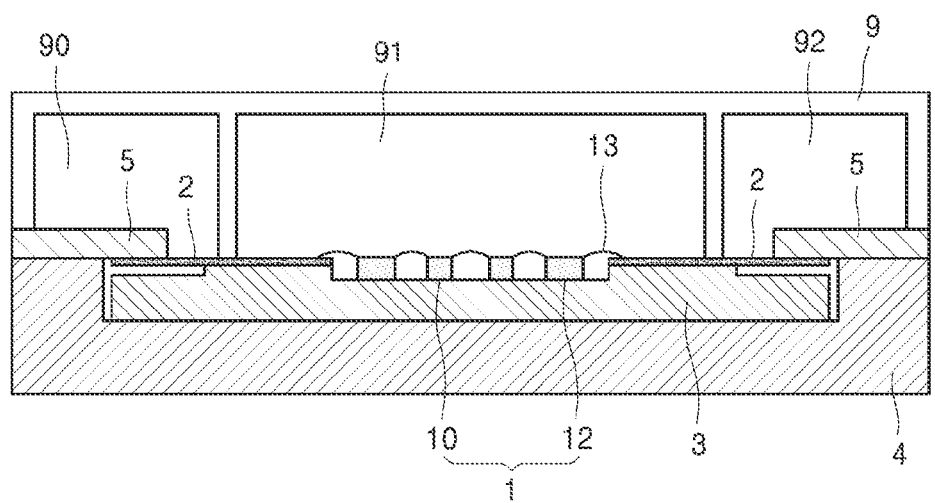
FIG. 2 is a cross-sectional view of an RF power amplifier module including one protective cover, according to an exemplary embodiment.

FIG. 2 is a cross-sectional view of an RF power amplifier module including one protective cover, according to an exemplary embodiment. A main difference between the exemplary embodiment of FIG. 1 and the exemplary embodiment of FIG. 2 is that the first protective cover 8 and the second protective cover 7 of FIG. 1 are replaced with only one protective cover 9. In detail, the protective cover 9 is fixed to the auxiliary circuit board 5 and the power circuit board 2. Also, the protective cover 9 defines a plurality of sub-cavities 90, 91, and 92 through clapboards that cover the auxiliary circuit board 5 and the power circuit board 2 and provide independent electromagnetic shielding and protection for the auxiliary circuit board 5 and the power circuit board 2. Other structures in the exemplary embodiment of FIG. 2 are the same as those in the exemplary embodiment of FIG. 1, and thus a detailed explanation thereof will not be repeated here.

Figure 3:
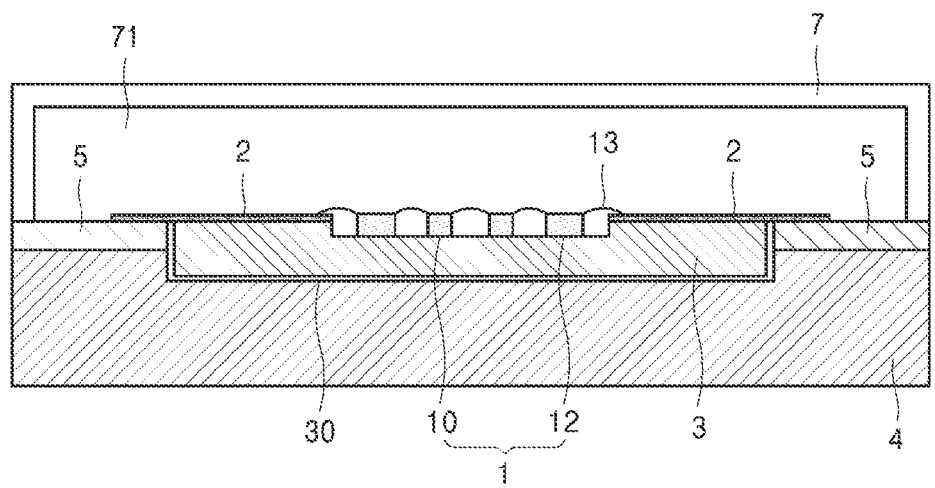
FIG. 3 is a cross-sectional view of an RF power amplifier module including a thermally conductive packing material, according to an exemplary embodiment.

FIG. 3 is a cross-sectional view of an RF power amplifier module including a thermally conductive packing material, according to an exemplary embodiment. A main difference between the exemplary embodiment of FIG. 1 and the exemplary embodiment of FIG. 3 is a method of mounting both sides of the power circuit board 2 on the other part of the auxiliary circuit board 5. In detail, referring to FIG. 3, the power circuit board 2 is disposed over the auxiliary circuit board 5, and is fixed to the auxiliary circuit board 5 by using soldering. A thermally conductive packing material 30 (e.g., thermally conductive silicon rubber) is disposed between the heat-dissipation substrate 3 and the housing 4 of the RF power amplifier module for promoting a heat-dissipation effect. Other structures in the exemplary embodiment of FIG. 3 are the same as those in the exemplary embodiment of FIG. 1, and thus a detailed explanation thereof will not be repeated here.

Figure 4:
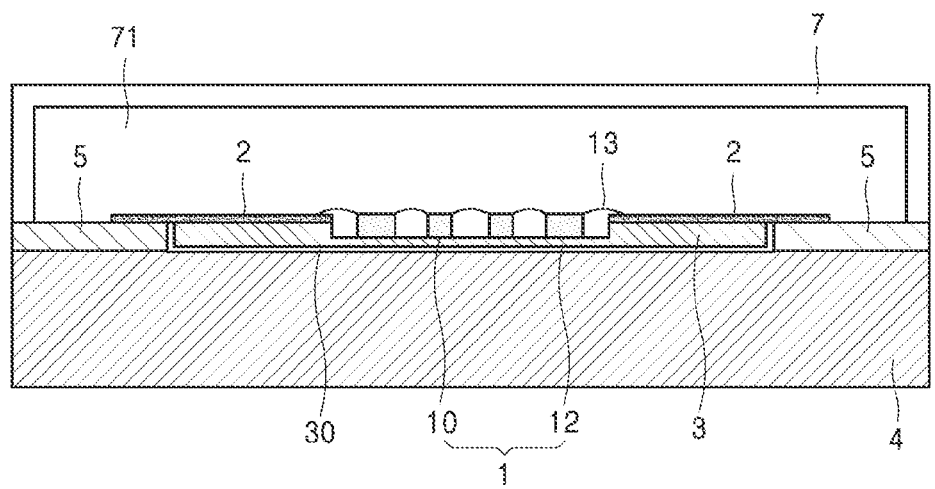
FIG. 4 is a cross-sectional view of an RF power amplifier module including a housing whose surface is flat, according to an exemplary embodiment.

FIG. 4 is a cross-sectional view of an RF power amplifier module including the housing 4 whose surface is flat, according to an exemplary embodiment. A main difference between the exemplary embodiment of FIG. 3 and the exemplary embodiment of FIG. 4 is a size of the heat-dissipation substrate 3. In detail, a size of the heat-dissipation substrate 3 in the exemplary embodiment of FIG. 4 is less than that of the heat-dissipation substrate 3 in the exemplary embodiment of FIG. 3. Referring to FIG. 4, the surface of the housing 4 of the RF power amplifier module is flat. Accordingly, both the heat-dissipation substrate 3 and the auxiliary circuit board 5 may be disposed on the surface of the housing 4 of the RF power amplifier module, and may be on almost the same plane. Other structures in the exemplary embodiment of FIG. 4 are the same as those in the exemplary embodiment of FIG. 3, and thus a detailed explanation thereof will not be repeated here.

Figure 5:
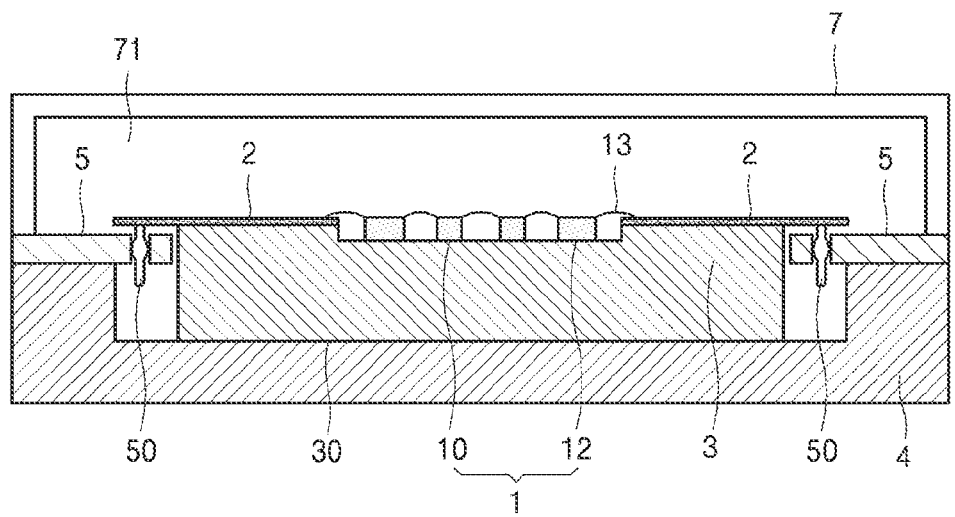
FIG. 5 is a cross-sectional view of an RF power amplifier module including a connector, according to an exemplary embodiment.

FIG. 5 is a cross-sectional view of an RF power amplifier module including a connector, according to an exemplary embodiment. A main difference between the exemplary embodiment of FIG. 3 and the exemplary embodiment of FIG. 5 is a method of mounting both sides of the power circuit board 2 on one part of a top surface of the auxiliary circuit board 5. Referring to FIG. 5, the auxiliary circuit board 5 is fixed to the both sides of the power circuit board 2 by using two connectors 50. Other structures in the exemplary embodiment of FIG. 5 are the same as those in the exemplary embodiment of FIG. 3, and thus a detailed explanation thereof will not be repeated here.

Figure 6A:
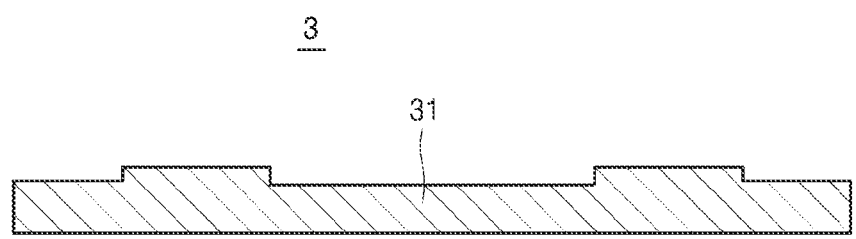
FIGS. 6A and 6B are cross-sectional views for explaining a heat-dissipation substrate of the RF power amplifier module, according to an exemplary embodiment.
Figure 6B:
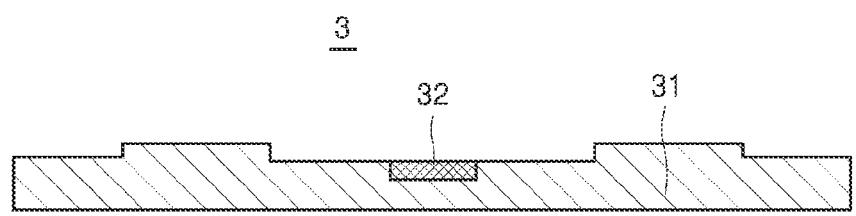

FIGS. 6A and 6B are cross-sectional views for explaining the heat-dissipation substrate 3 of the RF power amplifier module, according to an exemplary embodiment. Referring to FIG. 6A, the heat-dissipation substrate 3 may be one metal plate (or alloy plate) 31. Also, referring to FIG. 6B, the heat-dissipation substrate 3 may be formed by combining two metal plates (or alloy plates) 31 and 32.

Accordingly, the inventive concept provides an RF module that is used in a base station. The RF module includes at least the housing 4 and the RF power amplifier module that is disposed in the housing 4. A detailed explanation of the RF power amplifier module is the same as that given with reference to FIGS. 1 through 6B.

Accordingly, the inventive concept provides a base station including at least an antenna, a baseband unit, an RF module, and various signal transmission devices. The RF module includes at least the housing 4 and the RF power amplifier module that is disposed in the housing 4. A detailed explanation of the RF power amplifier module is the same as that given with reference to FIGS. 1 through 6B.

Accordingly, the inventive concept provides a method of manufacturing the RF power amplifier module that is used to assemble the RF power amplifier module of FIGS. 1 through 5. The RF power amplifier module includes at least the power device 1, the power circuit board 2, the heat-dissipation substrate 3, the auxiliary circuit board 5, and the input/output ports, and the power device 1 includes at least the power device die 10. A detailed explanation thereof is the same as that given with reference to FIGS. 1 through 5.

Figure 7:
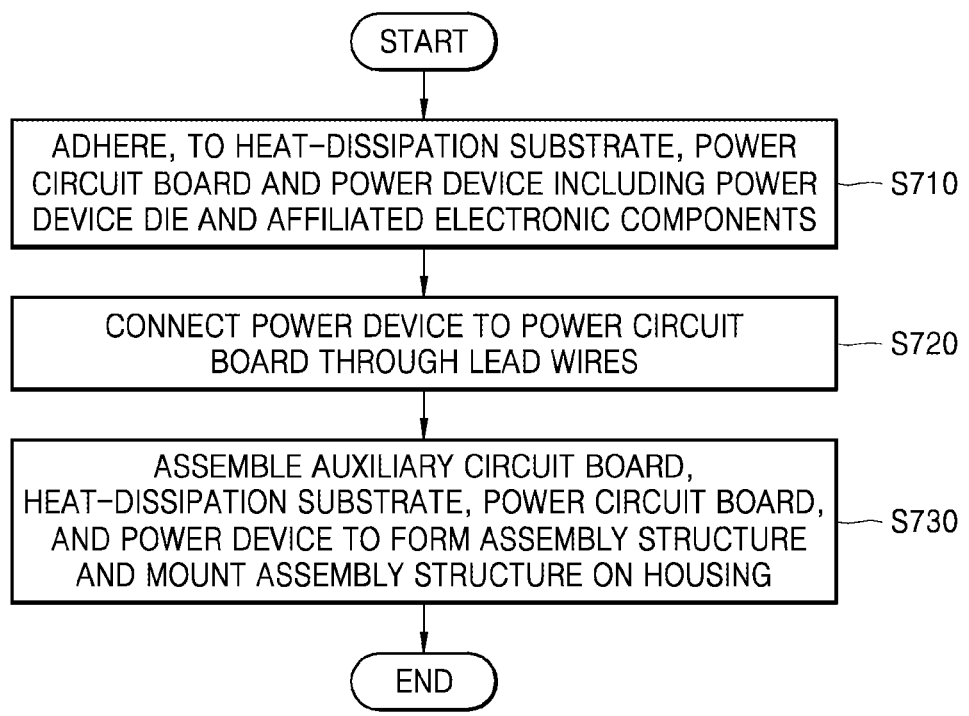
FIG. 7 is a flowchart of a method of assembling an RF power amplifier module, according to an exemplary embodiment.

FIG. 7 is a flowchart of a method of assembling an RF power amplifier module, according to an exemplary embodiment.

In operation S710, a power circuit board and a power device including a power device die and affiliated electronic components may be adhered to a heat-dissipation substrate. In this case, sizes and materials of the heat-dissipation substrate and the power circuit board may be determined based on requirements. Also, the power device die and the power circuit board that is adhered to the heat-dissipation substrate may be directly mounted when at least a part of both sides of the power circuit board may be in an impending state. An operation of assembling and soldering the affiliated electronic components of the power circuit board or assembling the affiliated electronic components by finishing a final soldering process may be performed.

In operation S720, the power device and the power circuit board may be connected to each other through lead wires in order to form a local power amplifier module. The local power amplifier module may include the power device, the heat-dissipation substrate, and the power circuit board.

In operation S730, an auxiliary circuit board, the heat-dissipation substrate, the power circuit board and the power device may be assembled, and a housing may be mounted. In this case, a part of the auxiliary circuit board is fixed to the housing of an RF module or an extending structure of the housing, the other part of the auxiliary circuit board is connected to the power circuit board, and the heat-dissipation substrate abuts onto the housing of the RF module.

In this case, the auxiliary circuit board and the power circuit board may be connected to each other by using, but is not limited to, soldering or connectors. For example, when a part of the auxiliary circuit board is connected to the power circuit board by using soldering, the auxiliary circuit board may be disposed over the power circuit board and then soldering may be performed, or the auxiliary circuit board may be disposed under the power circuit board and then soldering may be performed.

According to an exemplary embodiment, in order to form a closed cavity and to cover the power device and the affiliated electronic components, a first protective cover may be mounted on the power circuit board. Also, in order to form a closed cavity and to cover the auxiliary circuit board, the power device, and the first protective cover, a second protective cover may be mounted on the auxiliary circuit board.

Alternatively, a protective cover may be fixed to the power circuit board, and may define a plurality of cavities on the power device and the auxiliary circuit board. Due to the protective cover, the power circuit board and the auxiliary circuit board may be covered, and thus independent electromagnetic shielding and protection for the auxiliary circuit board 5 and the power circuit board 2 may be provided.

Figure 8:
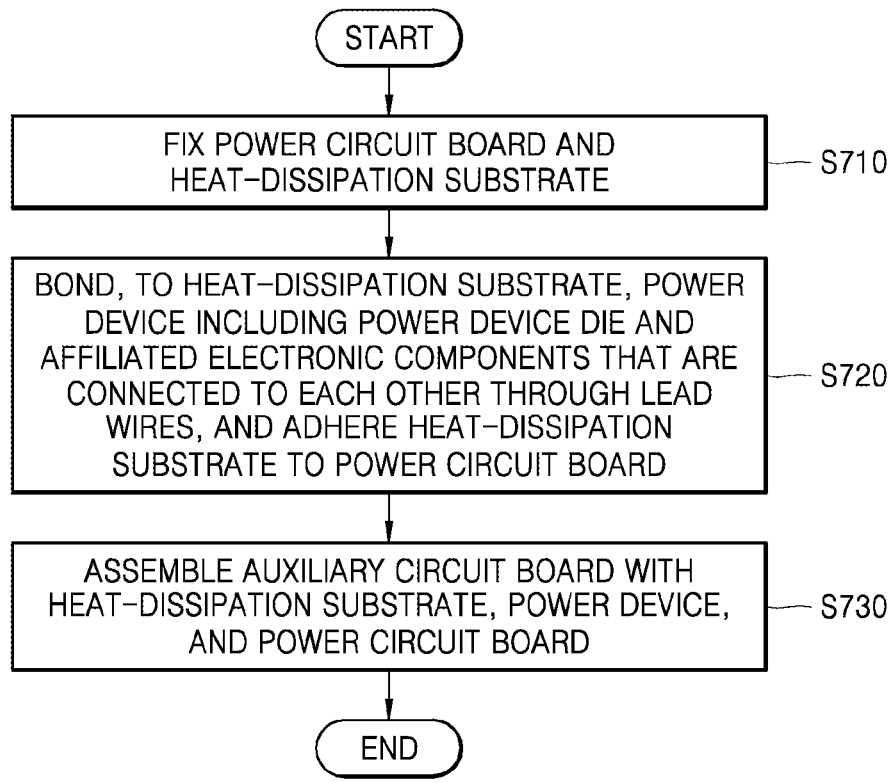
FIG. 8 is a flowchart of a method of assembling an RF power amplifier module, according to another exemplary embodiment.

FIG. 8 is a flowchart of a method of assembling an RF power amplifier module, according to another exemplary embodiment.

In operation S810, a power circuit board and a heat-dissipation substrate are fixed in order not to move in a next step. For example, the power circuit board and the heat-dissipation substrate may be fixed by using, but is not limited to, a jig.

In operation S820, a power device including a power device die and affiliated electronic components that are connected to each other through lead wires is bonded to the heat-dissipation substrate, and the heat-dissipation substrate and the power circuit board are adhered to each other. The heat-dissipation substrate, the power device, and the power circuit board may constitute a local amplifier module. For example, when the power circuit board and the heat-dissipation substrate are fixed by using a jig, the jig may be removed and then the local amplifier module may be assembled.

In operation 830, an auxiliary circuit board is assembled with the heat-dissipation substrate, the power device, and the power circuit board. When the auxiliary circuit board and the local amplifier module are connected to each other by using welding, it is necessary to fix the auxiliary circuit board and the local amplifier module before the auxiliary circuit board and the local amplifier module are assembled. When the auxiliary circuit board and the local amplifier module are connected to each other by using crimping, positions of the auxiliary circuit board and the local amplifier module on a housing have to be fixed.

Figure 9:
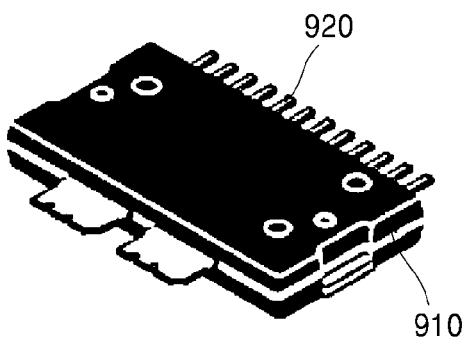
FIG. 9 is a perspective view of a package power device of the related art.

FIG. 9 is a perspective view of a package power device of the related art. Referring to FIG. 9, the conventional package power device includes a package structure 910 and input/output pins 920. In this case, the input/output pins 920 have to be mounted on a printed circuit board (PCB), which costs a lot.

When compared to the conventional package power device, a power device of an RF power amplifier module according to the inventive concept does not require a package structure and input/output pins. Instead, a power device die, affiliated electronic components, and a power circuit board may be connected to one another through packaging lead wires. Also, since the power circuit board according to the inventive concept is adhered to a heat-dissipation substrate, the heat-dissipation substrate may directly contact a housing of the RF power amplifier module in order to dissipate heat. The inventive concept results in a simple structure, low cost, and high heat-dissipation effect.

The RF power amplifier module according to the inventive concept may achieve large tolerance and low cost connection between the power circuit board and an auxiliary circuit board due to local deformation of the power circuit board, and may also achieve good pressure contact between the housing of the RF module and the heat-dissipation substrate without disposing a thermally conductive packing material having large tolerance. Accordingly, the cost is reduced and the manufacturing efficiency is improved.

Also, since the RF power amplifier module according to the inventive concept does not include a package structure, a degree of freedom for design is increased, an area occupied by the power circuit board is reduced, and a utilization rate is increased.

According to the inventive concept, only when an auxiliary circuit board having the same specification or the same circuit is used, a local power amplifier module is changed in order to form a new RF module.

While the inventive concept has been particularly shown and described with reference to exemplary embodiments thereof, it will be understood by one of ordinary skill in the art that various changes in form and details may be made therein without departing from the spirit and scope of the inventive concept as defined by the following claims. Hence, it will be understood that the embodiments described above are not limiting of the scope of the inventive concept. For example, each component described in a single type may be executed in a distributed manner, and components described distributed may also be executed in an integrated form.

The scope of the inventive concept is indicated by the claims rather than by the detailed description of the inventive concept, and it should be understood that the claims and all modifications or modified forms drawn from the concept of the claims are included in the scope of the inventive concept.

What is claimed is:

1. A radio frequency (RF) power amplifier module comprising:
   a power device comprising a power device die and affiliated electronic components that are connected to each other through lead wires;
   a power circuit board connected to the power device through the lead wires;
   a heat-dissipation substrate to which the power device and the power circuit board are adhered;
   an auxiliary circuit board connected to the power circuit board;
   a first protective cover fixed to the power circuit board and covering the power circuit board and the power device; and
   a second protective cover fixed to the auxiliary circuit board and covering the auxiliary circuit board, the power circuit board, and the first protective cover.

2. The RF power amplifier module of claim 1, wherein the first protective cover is configured to form a cavity between the first protective cover and the power device.

3. The RF power amplifier module of claim 2,
   wherein the first protective cover forms a cavity between the first protective cover and the power circuit board, and the second protective cover forms a cavity between the second protective cover and the first protective cover.

4. The RF power amplifier module of claim 2, wherein the protective cover is fixed to the auxiliary circuit board and covers the auxiliary circuit board, the power circuit board, and the power device.

5. The RF power amplifier module of claim 4, wherein the protective cover is fixed to the power circuit board and forms a plurality of cavities between the protective cover and the power device and the auxiliary circuit board.

6. The RF power amplifier module of claim 1, wherein the heat-dissipation substrate comprises one metal plate or alloy plate or a combination of at least two metal plates or alloy plates.

7. The RF power amplifier module of claim 1, wherein the power circuit board is adhered onto the auxiliary circuit board,
wherein the RF power amplifier module further comprises a thermally conductive packing material disposed between the heat-dissipation substrate and a housing or an extending structure of the housing.

8. The RF power amplifier module of claim 7, wherein a surface of the housing that is adhered to the thermally conductive packing material and a surface of the housing that is adhered to the auxiliary circuit board are flat.

9. The RF power amplifier module of claim 1, wherein the auxiliary circuit board is connected to the power circuit board through connectors, and the auxiliary circuit board is placed under the power circuit board.

10. A radio frequency (RF) module comprising:
the RF power amplifier module of claim 1; and
a housing fixing a part of the auxiliary circuit board and abutting onto the heat-dissipation substrate.

11. A base station comprising a radio frequency (RF) module, an antenna, a baseband unit, and a signal transmission unit,
wherein the RF module comprises:
the RF power amplifier module of claim 1; and
a housing fixing a part of the auxiliary circuit board and abutting onto the heat-dissipation substrate.

12. A method of assembling a radio frequency (RF) power amplifier module, the method comprising:
adhering, to a heat-dissipation substrate, a power circuit board and a power device that comprises a power device die and affiliated electronic components;
connecting the power device and the power circuit board through lead wires;
assembling an auxiliary circuit board, the heat-dissipation substrate, the power circuit board, and the power device to form an assembly structure, and mounting the assembly structure on a housing that abuts onto the heat-dissipation substrate;
mounting a first protective cover that is fixed to the power circuit board and covers the power circuit board and the power device; and
mounting a second protective cover that is fixed to the auxiliary circuit board and covers the auxiliary circuit board, the power circuit board, and the first protective cover.

13. The method of claim 12, wherein a cavity is formed between the first protective cover and the power device.

14. The method of claim 13,
wherein a cavity is formed between the first protective cover and the power circuit board and a cavity is formed between the second protective cover and the first protective cover.

15. The method of claim 13, wherein the mounting of the protective cover comprises mounting the protective cover that is fixed to the auxiliary circuit board,
wherein the protective cover covers the auxiliary circuit board, the power circuit board, and the power device.

16. The method of claim 15, wherein the protective cover is fixed to the power circuit board and forms a plurality of cavities between the protective cover and the power device and the auxiliary circuit board.

17. The method of claim 12, further comprising adhering the power circuit board on the auxiliary circuit board, and disposing a thermally conductive packing material between the heat-dissipation substrate and the housing or an extending structure of the housing.

18. The method of claim 17, wherein a surface of the housing that is adhered to the thermally conductive packing material and a surface of the housing that is adhered to the auxiliary circuit board are flat.

19. The method of claim 12, further comprising connecting the auxiliary circuit board and the power circuit board through connectors, and placing the auxiliary circuit board under the power circuit board.

20. A method of assembling a radio frequency (RF) power amplifier module, the method comprising:
fixing a power circuit board to a heat-dissipation substrate;
bonding, to the heat-dissipation substrate, a power device comprising a power device die and affiliated electronic components that are connected to each other through lead wires, and adhering the heat-dissipation substrate to the power circuit board;
assembling an auxiliary circuit board, the heat-dissipation substrate, the power device, and the power circuit board to form an assembly structure;
mounting a first protective cover that is fixed to the power circuit board and covers the power circuit board and the power device; and
mounting a second protective cover that is fixed to the auxiliary circuit board and covers the auxiliary circuit board, the power circuit board, and the first protective cover.

* * * * *